(12) United States Patent
Seol

(10) Patent No.: US 9,360,529 B2
(45) Date of Patent: Jun. 7, 2016

(54) BATTERY MODULE AND METHOD OF TESTING THE SAME

(71) Applicant: Samsung SDI Co., Ltd., Yongin-si, Gyeonggi-do (KR)

(72) Inventor: Ji-Hwan Seol, Yongin-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 383 days.

(21) Appl. No.: 13/673,161

(22) Filed: Nov. 9, 2012

(65) Prior Publication Data

US 2013/0342213 A1    Dec. 26, 2013

(30) Foreign Application Priority Data

Jun. 26, 2012    (KR) .................. 10-2012-0068767

(51) Int. Cl.
*G01R 31/36* (2006.01)
*H01M 10/42* (2006.01)
*H01M 2/10* (2006.01)

(52) U.S. Cl.
CPC .......... *G01R 31/3624* (2013.01); *H01M 10/42* (2013.01); *H01M 10/4257* (2013.01); *H01M 2/1016* (2013.01); *H01M 10/425* (2013.01); *H01M 2200/00* (2013.01)

(58) Field of Classification Search
CPC ........................ H01M 2/1016; G01R 31/3644
USPC .................................. 324/434; 429/123, 159
See application file for complete search history.

(56) References Cited

U.S. PATENT DOCUMENTS

| H280 H | * | 6/1987 | Thigpen ........................... 429/7 |
| 6,168,470 B1 | * | 1/2001 | Ikeda et al. .............. 439/620.08 |
| 7,927,728 B2 | | 4/2011 | Ha et al. |
| 2008/0211309 A1 | * | 9/2008 | Nolte .............................. 307/66 |
| 2010/0151299 A1 | | 6/2010 | Ha et al. |
| 2010/0248008 A1 | * | 9/2010 | Sugawara et al. ............. 429/159 |
| 2011/0097619 A1 | | 4/2011 | Park |
| 2011/0115437 A1 | * | 5/2011 | Kasai ............................ 320/134 |
| 2011/0135970 A1 | * | 6/2011 | Han et al. ........................ 429/7 |
| 2011/0268996 A1 | * | 11/2011 | Lee ................................. 429/7 |

FOREIGN PATENT DOCUMENTS

| JP | 11-120986 A | 4/1999 |
| JP | 2010238609 A | 10/2010 |
| KR | 1020050003923 A | 1/2005 |
| KR | 10-2008-0038663 A | 5/2008 |
| KR | 1020080038663 A | 5/2008 |
| KR | 10-2009-0010444 A | 1/2009 |

OTHER PUBLICATIONS

Korean Office Action issued by Korean Patent Office on Jan. 21, 2016 corresponding to 10-2012-0068767 and Request for Entry of the Accompanying Office Action attached herewith.

* cited by examiner

*Primary Examiner* — Drew A Dunn
*Assistant Examiner* — Jerry D Robbins
(74) *Attorney, Agent, or Firm* — Robert E. Bushnell, Esq.

(57) ABSTRACT

A battery module may include a plurality of rechargeable batteries; a receiving member that inserts the rechargeable batteries; a protective circuit module that is fixed on the receiving member and that is electrically connected to the rechargeable batteries; a circuit connector that is connected to the protective circuit module and that has a plurality of terminals; and a battery connector that is electrically connected to the rechargeable batteries and that is coupled to the circuit connector.

19 Claims, 4 Drawing Sheets

BATTERY MODULE AND METHOD OF TESTING THE SAME

CLAIM OF PRIORITY

This application makes reference to, incorporates the same herein, and claims all benefits accruing under 35 U.S.C. §119 from an application earlier filed in the Korean Intellectual Property Office on 26 Jun. 2012 and there duly assigned Serial No. 10-2012-0068767.

BACKGROUND OF THE INVENTION

1. Field of the Invention

The described technology relates generally to a battery module and a method of testing the same.

2. Description of the Related Art

A rechargeable battery can be repeatedly charged and discharged unlike a primary battery that is incapable of being recharged. A rechargeable battery of a low capacity is used for a small portable electronic device such as a mobile phone, a laptop computer, and a camcorder, and a large capacity battery is widely used as a power source for driving a motor of a hybrid vehicle, etc.

Further, one large capacity battery module is formed with a plurality of rechargeable batteries that are generally coupled in series, and the rechargeable battery may be formed in a cylindrical shape and a square shape. The above information disclosed in this Related Art Section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a battery module having advantages of easily testing a performance of a protective circuit module.

An exemplary embodiment of the present invention provides a battery module including: a plurality of rechargeable batteries; a receiving member that inserts the rechargeable batteries; a protective circuit module that is fixed on the receiving member and that is electrically connected to the rechargeable batteries; a circuit connector that is connected to the protective circuit module and that has a plurality of terminals; and a battery connector that is electrically connected to the rechargeable batteries and that is coupled to the circuit connector.

A molding layer that encloses the protective circuit module may be formed on the protective circuit module, a plurality of bus bars that electrically connect the rechargeable batteries may be installed in the rechargeable batteries, and a data line that is installed in the battery connector may be connected to the bus bar.

A plurality of sensing lines that are coupled to a measurement element that is installed in the protective circuit module and that are connected to the data line may be connected to the circuit connector, and a control communication line that is coupled to a control element that is installed in the protective circuit module may be connected to the circuit connector.

The circuit connector and the battery connector may be detachably coupled, a plurality of grooves or protrusions may be formed in the circuit connector, and a plurality of protrusions or grooves that are detachably coupled to the groove or the protrusion may be formed in the battery connector.

Another embodiment of the present invention provides a method of testing a battery module, wherein the battery module may include a circuit connector that is connected to a protective circuit module that is enclosed by a molding layer and a battery connector that is coupled to the circuit connector and that is electrically connected to a plurality of rechargeable batteries, the method may include testing a protective circuit module by coupling the circuit connector and a first text connector that is connected to a protective circuit module tester; and testing a rechargeable battery by coupling the battery connector and a second text connector that is connected to a battery tester.

A plurality of sensing lines that are coupled to a measurement element that is installed in the protective circuit module and a plurality of control unit communication lines that are coupled to a control element that is installed in the protective circuit module may be connected in the circuit connector.

According to the present invention, because a first connector and a second connector are installed, a protective circuit module and rechargeable batteries can be easily and stably connected.

Further, a protective circuit module and rechargeable batteries can be easily tested, particularly, because a control unit communication line is connected, a performance of a control element as well as a measurement element can be tested.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
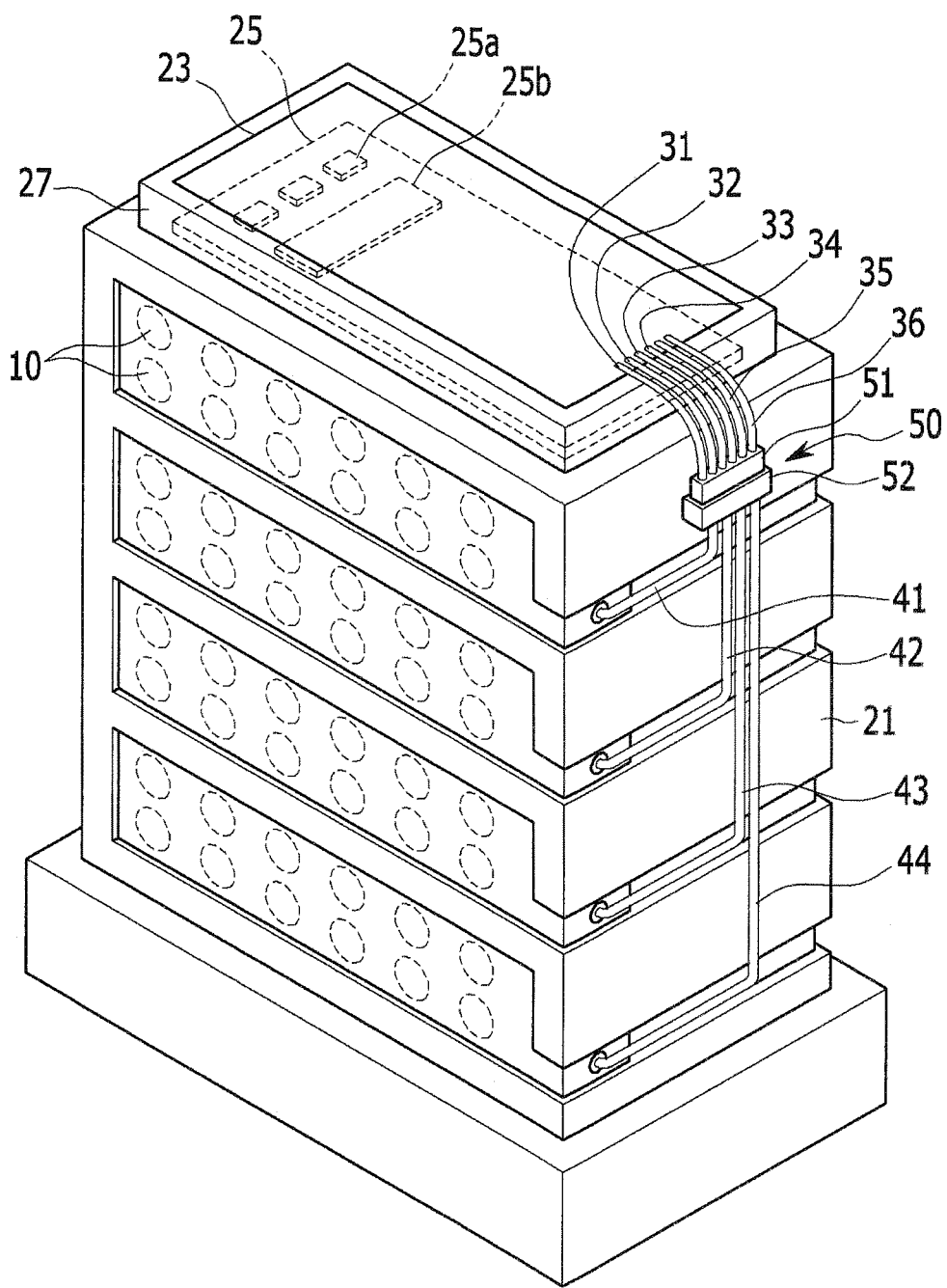
FIG. 1 is a perspective view illustrating a battery module according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The inventive concept may, however, be embodied in many different forms and should not be construed as limited to the example embodiments set forth herein. In the drawings, the sizes and relative sizes of layers and regions may be exaggerated for clarity. Like reference numerals designate like elements throughout the specification and drawings.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A protective circuit board may be generally provided for measuring and controlling a voltage and a current of each rechargeable battery is installed in the battery module. Measurement elements for measuring a current, a voltage, and a temperature of rechargeable batteries and a control element for preventing overcharge and overcurrent are installed in the protective circuit board. Such a protective circuit board is to prevent overcharge and over-discharge of a battery module, and it is very important to accurately measure a current, a voltage, and a temperature and to accurately control rechargeable batteries. When the protective circuit board does not accurately operate, overcurrent and overcharge are not controlled and thus a problem of explosion or firing of a battery module may occur.

However, after the protective circuit board is installed in a frame, it is difficult to test whether the protective circuit board stably operates.

Figure 2:
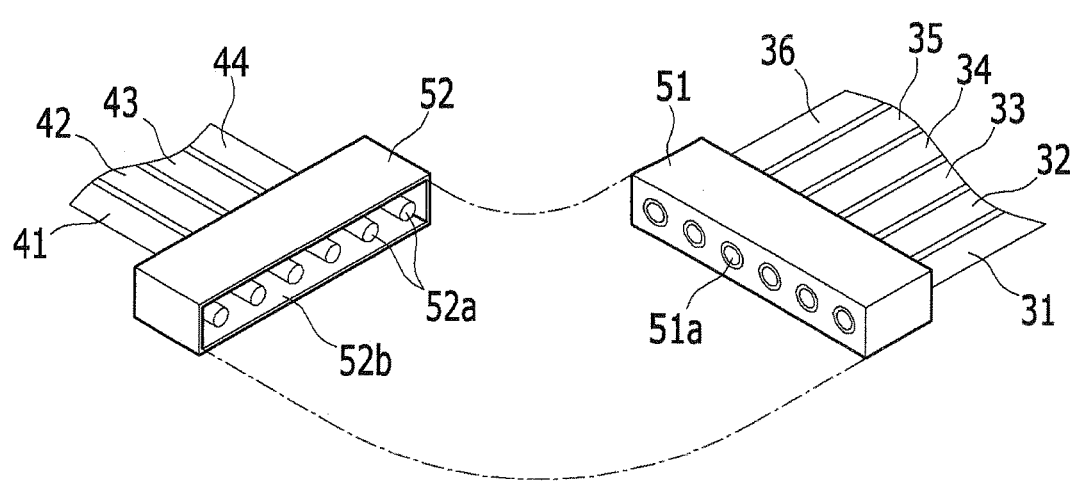
FIG. 2 is an exploded perspective view illustrating a circuit connector and a battery connector according to an exemplary embodiment of the present invention.

FIG. 1 is a perspective view illustrating a battery module according to an exemplary embodiment of the present invention, and FIG. 2 is an exploded perspective view illustrating a circuit connector and a battery connector according to an exemplary embodiment of the present invention.

Referring to FIGS. 1 and 2, a battery module 100 according to the present exemplary embodiment may include rechargeable batteries 10, a receiving member 21 into which the rechargeable batteries 10 are inserted, and a protective circuit module 25 that is electrically connected to the rechargeable battery 10 and that is fixed to the receiving member 21.

The rechargeable battery 10 according to the present exemplary embodiment may include an electrode assembly that is formed in a cylindrical shape and that is inserted into a case and that has a positive electrode and a negative electrode, a cap plate that is coupled to an opening of the case, and a terminal that is protruded to the outside of the case. The present exemplary embodiment exemplifies a cylindrical rechargeable battery, but the present invention is not limited thereto and the rechargeable battery may be formed in a square shape or other shapes.

The rechargeable batteries 10 are fixed within the receiving member 21, and the receiving member 21 is formed in a frame form that fixes the rechargeable batteries 10. However, the present invention is not limited thereto and the receiving member may be formed in a case form.

The rechargeable batteries 10 are coupled in series or in parallel to an adjacent rechargeable battery 10 by a bus bar 50. A plurality of rechargeable batteries 10 that are formed in two lines form a battery assembly, and the rechargeable batteries 10 constituting the battery assembly are electrically connected by one bus bar 50. A plurality of battery assemblies are installed in the receiving member 21, and one bus bar 50 is connected to each battery assembly. The rechargeable batteries 10 may be coupled in series by the bus bar 50 and may be coupled in series and in parallel.

Data lines 41, 42, 43, and 44 for measuring a voltage and a current are installed in each bus bar 50. A battery connector 52 having a plurality of terminals is connected to the data lines 41, 42, 43, and 44.

A circuit mounting unit 27 for inserting the protective circuit module 25 is formed in an upper part of the receiving member 21, and the protective circuit module 25 is inserted into and disposed at a groove of the circuit mounting unit 27. A measurement element 25a that measures a temperature, a voltage, and a current of the rechargeable batteries 10 and a control element 25b that controls charge and discharge of the rechargeable batteries 10 are installed in the protective circuit module 25.

A molding layer 23 enclosing the protective circuit module 25 is formed on the protective circuit module 25. The molding layer 23 performs a function of preventing a foreign substance such as moisture and dust from penetrating to the protective circuit module 25. The molding layer 23 may be made of a synthetic resin such as polyurethane. As in the present exemplary embodiment, when the molding layer 23 is installed to enclose the protective circuit module 25, the protective circuit module 25 can be stably prevented from being short-circuited or erroneously operating due to an external foreign substance.

A plurality of sensing lines 31, 32, 33, and 34 that are connected to the measurement element 25a and a plurality of control communication lines 35 and 36 that are connected to the control element 25b are installed in the protective circuit module 25. The sensing lines 31, 32, 33, and 34 are connected to the data lines 41, 42, 43, and 44 to perform a function of transferring information about a voltage, a current, and a temperature of rechargeable batteries to the protective circuit module 25.

The sensing lines 31, 32, 33, and 34 and the control communication lines 35 and 36 are connected to a circuit connector 51.

The circuit connector 51 has a plurality of terminals 51a that are formed in a groove form. The battery connector 52 has a plurality of terminals 52a that are formed in a protrusion form. A groove 52b is formed in the battery connector 52, and the terminal 52a is protruded within the groove 52b.

The present exemplary embodiment illustrates that the terminal 51a of the circuit connector 51 is formed in a groove form, and the terminal 52a of the battery connector 52 is formed in a protrusion form, but the present invention is not limited thereto, and a terminal of a circuit connector may be formed in a groove form, and a terminal of a battery connector may be formed in a protrusion form.

The circuit connector 51 and the battery connector 52 is detachably coupled, and in this case, the terminal 51a of the circuit connector 51 and the terminal 52a of the battery connector 52 are insertion-coupled to be electrically connected. The circuit connector 51 is inserted into and coupled to the groove 52b that is formed in the battery connector 52.

As described above, according to the present exemplary embodiment, the protective circuit module 25 and the rechargeable batteries 10 can be easily electrically connected using the circuit connector 51 and the battery connector 52 and thus a voltage, a current, and a temperature of the rechargeable batteries 10 can be more stably and easily measured and the rechargeable batteries 10 can be controlled.

The sensing lines 31, 32, 33, and 34 are connected to the data lines 41, 42, 43, and 44 through the battery connector 52, and the control communication lines 35 and 36 are not connected to the data lines 41, 42, 43, and 44.

After the protective circuit module 25 is molded, when testing whether the protective circuit module 25 and the rechargeable batteries 10 are in an abnormal state, after separating the circuit connector 51 and the battery connector 52, by connecting the circuit connector 51 or the battery connector 52 to a testing device, it can tested whether the protective circuit module 25 and the rechargeable battery 10 are in an abnormal state.

Particularly, because the control communication lines 35 and 36 that are connected to the control element 25b are connected to the circuit connector 51, it may be detected whether the control element 25b as well as the measurement element 25a is in an abnormal state.

Figure 3:
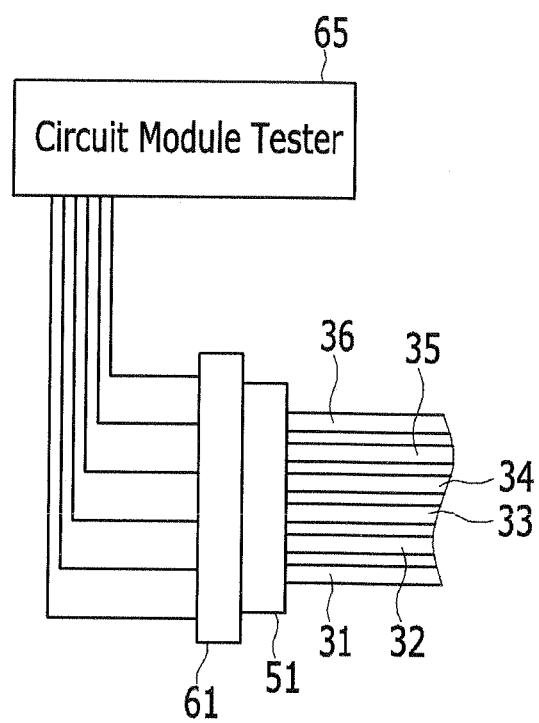
FIG. 3 is a diagram illustrating a state in which a circuit connector and a battery management system (BMS) tester are connected.
Figure 4:
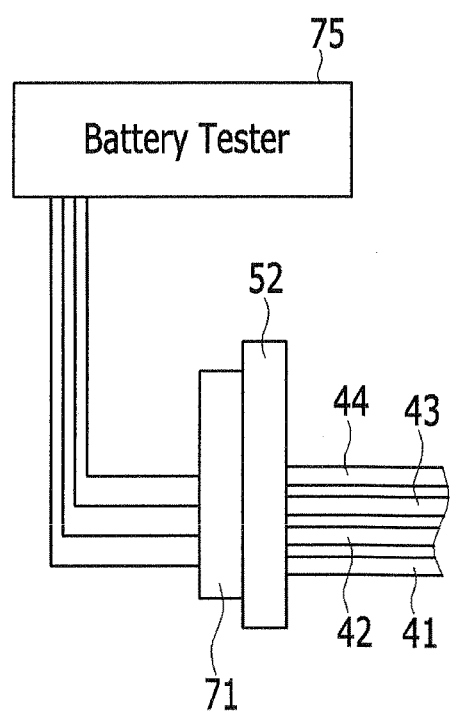
FIG. 4 is a diagram illustrating a state in which a battery connector and a battery tester are connected.

FIG. 3 is a diagram illustrating a state in which a circuit connector and a Circuit Module tester are connected, and FIG. 4 is a diagram illustrating a state in which a battery connector and a battery tester 75 are connected.

Referring to FIGS. 3 and 4, a method of testing the battery module 100 according to the present exemplary embodiment will be described. The method of testing the battery module 100 according to the present exemplary embodiment may include a circuit test step of testing the protective circuit module 25 by coupling the circuit connector 51 and a first test connector 61 that is connected to the circuit module tester 65 and battery test step of testing the rechargeable batteries 10 by coupling the battery connector 52 and a second test connector 71 that is connected to the battery tester 75.

At the circuit test step, after separating the circuit connector 51 and the battery connector 52, the circuit connector 51 is coupled to the first test connector 61. The first test connector 61 is connected to the circuit module tester 65, and the circuit module tester 65 tests whether the measurement element 25a and the control element 25b that are installed in the protective circuit module 25 are in an abnormal state.

According to the present exemplary embodiment, even in a case where the molding layer 23 is formed, it can be tested whether the protective circuit module 25 is in an abnormal state using the circuit connector 51.

At the battery test step, the battery connector 52 and a second test connector 71 are coupled. The second test connector 71 is connected to the battery tester 75, and the battery tester 75 tests whether a voltage and a current of the rechargeable battery 10 are in an abnormal state.

In this case, the circuit module tester 65 and the battery tester 75 may be formed into separate devices and may be integrally installed in one device.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A battery module comprising;
a plurality of rechargeable batteries;
a plurality of receiving members, said plurality of rechargeable batteries are inserted into each of the plurality of receiving members, said plurality of receiving members are stacked one on top of another with adjacent receiving members being in physical contact with each other;
a single bus bar electrically connecting all rechargeable batteries of the plurality of rechargeable batteries within solely a single receiving member of the plurality of receiving members;
a protective circuit module that is affixed to and in physical contact with solely one of the plurality of receiving members and that is electrically connected to the rechargeable batteries contained in each of the plurality of receiving members via the single bus bar;
a measurement element that measures a temperature, a voltage, and a current of the plurality of rechargeable batteries is installed and entirely contained within the protective circuit module;
a control element that controls charge and discharge of the plurality of rechargeable batteries is installed and entirely contained within the protective circuit module;
a molding layer having a rectangular prism shape made of a synthetic resin that fills the circuit mounting unit and entirely encloses the protective circuit module preventing the protective circuit module from being short-circuited or erroneously operating due to an external foreign substance coming in contact with the protective circuit module;

a circuit connector that is connected to the protective circuit module and having a plurality of terminals; and
a battery connector that is electrically connected to the rechargeable batteries and coupled to the circuit connector.

2. The battery module of claim 1, wherein a plurality of bus bars that electrically connect the rechargeable batteries are installed in the rechargeable batteries, and
a data line that is installed in the battery connector is connected to the bus bar.

3. The battery module of claim 2, wherein a plurality of sensing lines that are coupled to the measurement element that is installed in the protective circuit module and that are connected to the data line are connected to the circuit connector.

4. The battery module of claim 3, wherein a control communication line that is coupled to the control element that is installed in the protective circuit module is connected to the circuit connector.

5. The battery module of claim 1, wherein the circuit connector and the battery connector are detachably coupled.

6. The battery module of claim 5, wherein a plurality of grooves or protrusions are formed in the circuit connector, and a plurality of protrusions or grooves that are detachably coupled to the groove or the protrusion are formed in the battery connector.

7. A method of testing a battery module, wherein the battery module comprises a circuit connector that is connected to a protective circuit module that is enclosed by a molding layer and a battery connector that is coupled to the circuit connector and that is electrically connected to a plurality of rechargeable batteries, a single bus bar electrically connecting all rechargeable batteries of the plurality of rechargeable batteries contained within solely a single receiving member of a plurality of receiving members, said plurality of receiving members are stacked one on top of another with adjacent receiving members being in physical contact with each other, said method comprises;
testing a protective circuit module by coupling the circuit connector and a first text connector that is connected to a protective circuit module tester; and
testing a rechargeable battery by coupling the battery connector via the single bus bar and a second text connector that is connected to a battery tester,
wherein said protective circuit module that is affixed to and in physical contact with solely one of the plurality of receiving members and includes a measurement element that measures a temperature, a voltage, and a current of the plurality of rechargeable batteries is installed and entirely contained within the protective circuit module and a control element that controls charge and discharge of the plurality of rechargeable batteries is installed and entirely contained within the protective circuit module, and
wherein said molding layer having a rectangular prism shape made of a synthetic resin that fills the circuit mounting unit and entirely encloses the protective circuit module preventing the protective circuit module from being short-circuited or erroneously operating due to an external foreign substance coming in contact with the protective circuit module.

8. The method of claim 7, wherein a plurality of sensing lines that are coupled to the measurement element that is installed in the protective circuit module and a plurality of control unit communication lines that are coupled to the control element that is installed in the protective circuit module are connected in the circuit connector.

9. A battery testing system, comprising:
a plurality of battery assemblies contained within a plurality of receiving members stacked one on top of another;
a plurality of rechargeable batteries contained within each battery assembly of the plurality of battery' assembles, said plurality of battery assembles are stacked one on top of another with adjacent battery assembles being in physical contact with each other;
a single bus bar electrically connecting all rechargeable batteries of the plurality of rechargeable batteries within solely a single battery assembly of the plurality of battery assembles;
a plurality of data lines, each data line of the plurality of data lines connected to the single bus bar and receive temperature, voltage and current information for the single battery assembly;
a protective circuit module (PCM) electrically connected to each battery assembly of the plurality of battery assembles via a plurality of sensing lines, said protective circuit module (PCM) is affixed to and in physical contact with solely one of the plurality of battery assembles and includes a measurement element that measures a temperature, a voltage, and a current of the plurality of rechargeable batteries is installed and entirely contained within the protective circuit module and a control element that controls charge and discharge of the plurality of rechargeable batteries is installed and entirely contained within the protective circuit module;
a molding layer having a rectangular prism shape made of a synthetic resin that fills the circuit mounting unit and entirely encloses the protective circuit module preventing the protective circuit module from being short-circuited or erroneously operating due to an external foreign substance coming in contact with the protective circuit module;
a circuit connector that is connected to the protective circuit module via the plurality of sensing lines and that has a plurality of terminals; and
a battery connector connected to the battery assembles via said plurality of data lines that transmit said temperature, voltage and current information to the PCM, said battery connector is coupled to the circuit connector via the plurality of terminals.

10. The battery testing system recited in claim 9, wherein the measurement element is connected to the plurality of sensing lines; and
the control element controls charge and discharge of the plurality of rechargeable batteries based on said temperature, voltage and current information.

11. The battery testing system recited in claim 10, wherein the circuit connector has grooves and the plurality of terminals of the battery connector have protrusions which fit into the grooves.

12. The battery testing system recited in claim 11, wherein the circuit connector and the battery connector are detachably coupled.

13. The battery testing system recited in claim 12, wherein when battery testing occurs, the circuit connector and the battery connector are disconnected and the battery connector is connected to a battery tester.

14. The batter testing system recited in claim 13, wherein when circuit module testing occurs, the circuit connector and the battery connector are disconnected and the circuit connector is connected to a circuit module tester.

15. The battery testing system recited in claim 14, wherein circuit module testing, and battery testing occur at the same time.

16. The battery testing system recited in claim 14, wherein circuit module testing and battery testing occur at different times.

17. The battery testing system recited in claim 14, wherein the circuit module tester runs diagnostics to determine the integrity of the circuit module.

18. The battery testing system recited in claim 17, wherein battery module tester receives the temperature, voltage and current information from the plurality of rechargeable batteries to determine the operational characteristics of each of the plurality of rechargeable batteries.

19. The battery testing system recited in claim 18, wherein battery module tester determines the plurality of rechargeable batteries are in an abnormal state when the temperature, voltage or current information exceed a determined range.

* * * * *